US005675291A

United States Patent [19]
Sudjian

[11] Patent Number: 5,675,291
[45] Date of Patent: Oct. 7, 1997

[54] PHASE-LOCK LOOP WITH REDUCED ACQUISTION TIME

[75] Inventor: Douglas Sudjian, Santa Clara, Calif.

[73] Assignee: National Semiconductor Corporation, Santa Clara, Calif.

[21] Appl. No.: 602,911

[22] Filed: Feb. 16, 1996

[51] Int. Cl.[6] .................................................. H03L 7/093
[52] U.S. Cl. .............................. 331/17; 331/25; 331/14
[58] Field of Search ................................ 331/17, 25, 14

[56] References Cited

U.S. PATENT DOCUMENTS

| | | | |
|---|---|---|---|
| 5,170,130 | 12/1992 | Ichihara | 328/155 |
| 5,247,265 | 9/1993 | Norimatsu | 331/16 |
| 5,276,408 | 1/1994 | Norimatsu | 331/8 |
| 5,334,953 | 8/1994 | Mijuskovic | 331/8 |
| 5,424,689 | 6/1995 | Gillig et al. | 331/17 |
| 5,461,344 | 10/1995 | Andoh | 331/1 A |

OTHER PUBLICATIONS

"Dual PLL IC Achieves Fastest Lock Time with Minimal Reference Spurs", RF Synthesizers National Semiconductor, William O. Keese, Aug. 1995, pp. 30–38.

"The Art Of Electronics" Second Edition, Paul Horowitz, Winfield Hill, Cambridge University Press, 1980, pp. 641–653.

Primary Examiner—Robert Pascal
Assistant Examiner—An Luu
Attorney, Agent, or Firm—Limbach & Limbach L.L.P.

[57] ABSTRACT

A control signal generation circuit is particularly suited for use in a phase lock loop circuit. The control signal generation circuit provides a control signal to a voltage controlled oscillator. The control signal is provided in response to a phase difference signal provided by phase comparator circuitry. Charge pump circuitry includes a primary current source that provides a primary current signal in response to the phase/frequency difference signal. A secondary current source provides a secondary current signal, also in response to the phase/frequency difference signal. The control signal generation circuit also includes filter circuitry. The filter circuitry includes a resistance element connected between a first input, which is connected to receive the primary current signal, and a second input, which is connected to receive the secondary current signal. A capacitance element, connected in series to the resistive element, is connected between the second input and ground. A voltage, relative to ground, is developed at the first input and is provided as the control signal.

5 Claims, 6 Drawing Sheets

PHASE-LOCK LOOP WITH REDUCED ACQUISTION TIME

TECHNICAL FIELD

The present invention relates to phase-lock loop circuits and, in particular, to an improved charge pump circuit for use in a phase-lock loop circuit such that the phase-lock loop circuit which includes the improved charge pump circuit has a decreased loop acquisition time when the loop reacquires "lock" in response to phase/frequency changes.

BACKGROUND

Phase-lock loop circuits ("PLL's") are well-known. For example, one common application for a PLL is a frequency synthesizer. A frequency synthesizer generates an output signal whose frequency can be one of various fixed multiples (e.g., N) of a given reference signal. Thus, the PLL accomplishes frequency multiplication based upon a fixed reference input. FIG. 1 is a block diagram illustrating a conventional PLL 10 used for frequency multiplication. A reference signal L, having frequency $f_L$ and phase $\phi_L$ is generated by a reference signal generator 12. Meanwhile, a voltage controlled oscillator 14 generates an output signal OUT, having frequency $f_{out}$ and phase $\phi_{out}$, in response to a control voltage $V_2$ provided at the input of VCO 14. Once the PLL has "locked on" to the reference signal L, the frequency $f_{out}$ is N times $f_L$.

To "close the loop", the output signal OUT is provided to a "divide by N" circuit 16, which provides an output signal COMP, having a frequency $f_{COMP}$ such that $f_{COMP}$ is $f_{OUT}$ divided by N. The signal COMP and the signal L are provided to a phase/frequency detector 18. The phase/frequency detector 18 is of the type which provides output voltage error pulses whose duration represents the magnitude of the time difference between $\phi_L$ and $\phi_{COMP}$ and whose polarity represents the polarity of the time difference between $\phi_L$ and $\phi_{COMP}$.

A charge pump circuit 20 provides output current pulses of magnitude I and the duration of which are a function of the voltage pulses provided from the phase detector 18. A loop filter circuit 22 is a charge storage device, which charges and discharges responsive to the output current pulses I provided from the charge pump circuit 20. The charge stored by the loop filter circuit 22 is provided to the VCO 14 as the control voltage $V_2$.

FIG. 2 is a schematic diagram illustrating a conventional arrangement of the charge pump circuit 20 and the loop filter 22. In particular, a current source $I_P$ of the charge pump circuit 20 provides current pulses (for convenience of reference, also denoted as $I_P$), responsive to the phase/frequency difference pulses provided from the phase/frequency detector 18. The loop filter 22 includes a resistor R2 and a capacitor C1 connected in series. The capacitor C1 charges and/or discharges in response to the current pulses $I_P$. That is, the combination of the resistor R2 and the capacitor C1 integrates, over time, the time-averaged charge provided by the current pulses $I_P$ and stores the charge as the control voltage $V_2$ across capacitor C1. Thus, a control voltage $V_2$ is established and provided as a control voltage to control the VCO 14.

The filtering function of the loop filter 22, in accordance with the circuit arrangement shown in FIG. 2, ensures that the VCO output frequency $f_{out}$ changes smoothly in response to changes in the reference signal frequency $f_L$. However, a disadvantage of the circuit arrangement shown in FIG. 2 is that a PLL 10 which employs this fixed circuit arrangement may not "lock" onto changes in the reference signal frequency $f_L$ quickly enough for a particular application.

SUMMARY

The present invention provides a control signal generation circuit which is particularly suited for use in a phase lock loop circuit. The control signal generation circuit provides a control signal to a voltage controlled oscillator. The control signal is provided in response to a phase difference signal provided by phase/frequency comparator circuitry. Charge pump circuitry includes a primary current source that provides a primary current signal in response to the phase/frequency difference signal. A secondary current source provides a secondary current signal, also in response to the phase/frequency difference signal.

The control signal generation circuit also includes filter circuitry. The filter circuitry includes a resistance element connected between a first input, which is connected to receive the primary current signal, and a second input, which is connected to receive the secondary current signal. A capacitance element, connected in series to the resistance element, is connected between the second input and ground. A voltage, relative to ground, is developed at the first input and is provided as the control signal.

DETAILED DESCRIPTION

Figure 1:
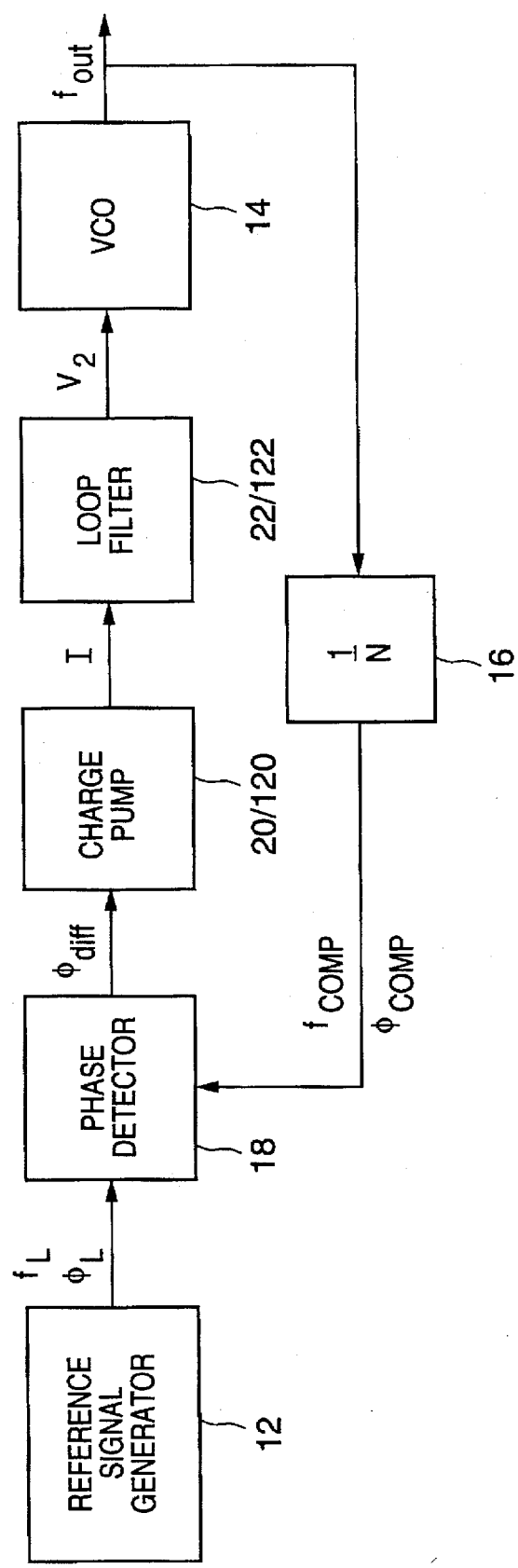
FIG. 1 illustrates, in block form, a phase lock loop circuit (PLL) 10.
Figure 2:
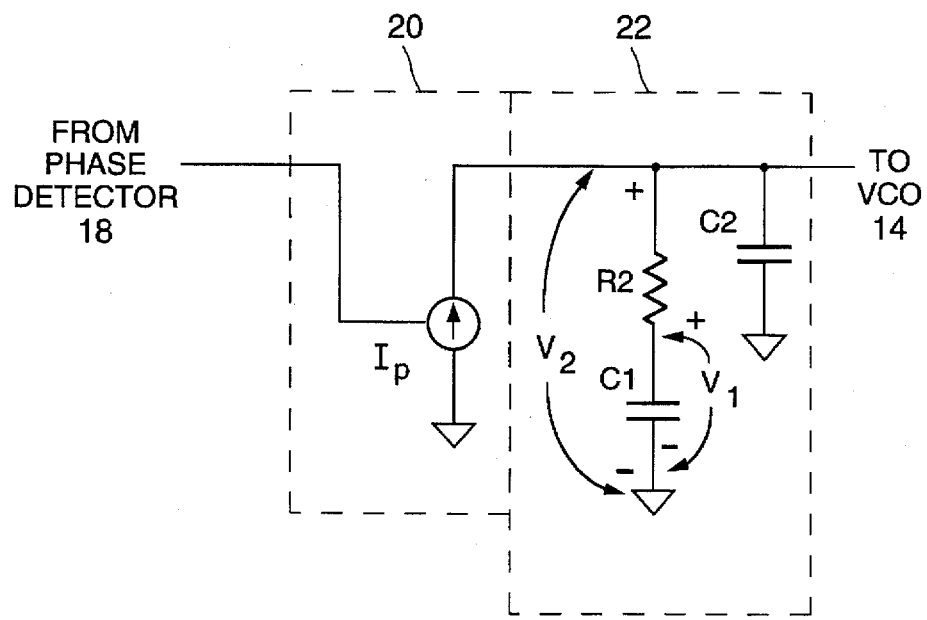
FIG. 2 schematically illustrates a conventional arrangement of the charge pump circuit and the loop filter circuit (designated by the reference numerals 20 and 22, respectively) of the PLL 10.
Figure 3:
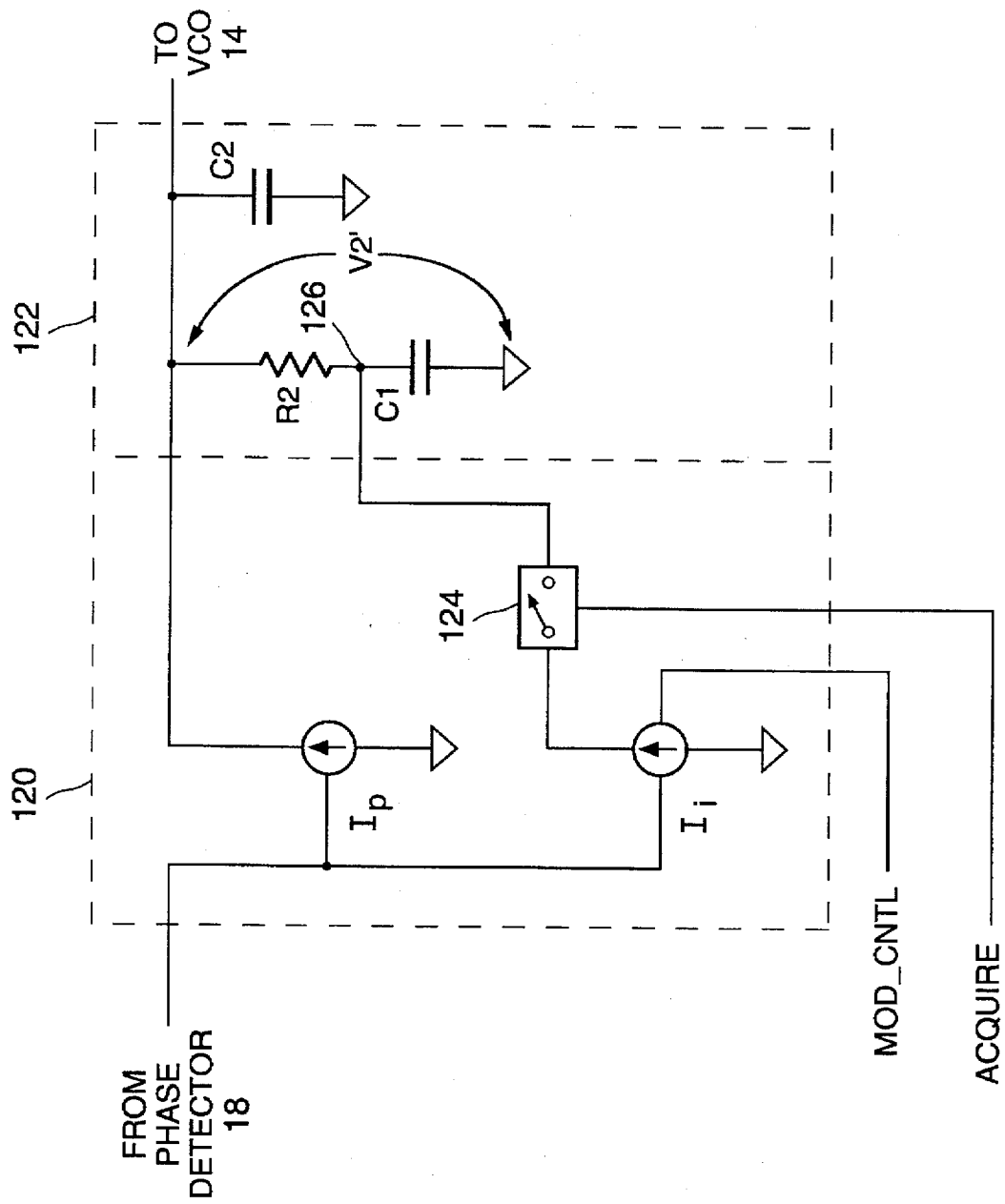
FIG. 3 schematically illustrates an arrangement of the charge pump circuit and the loop filter in accordance with an embodiment of the present invention (designated by the reference numerals 120 and 122, respectively).

FIG. 3 schematically illustrates an arrangement of the charge pump circuit 120 and the loop filter 122 in accordance with an embodiment of the present invention. Where the components are the same as those of FIG. 2, they are given the same reference designations. For example, the resistor R2 and capacitor C1 shown in FIG. 3 are identical to the resistor R2 and capacitor C1 shown in FIG. 2.

As shown in FIG. 3, the charge pump circuit 120 includes an additional current source $I_i$ (i.e., in addition to the current source $I_p$) which also provides current pulses $I_i$ in response to the output voltage pulses provided from the phase detector 18. The current source $I_i$ is selectively connected, via a switch 124, to an internal node 126 of the loop filter 122. The internal node 126 is between the resistor R2 and the capacitor C1. In a preferred method of operating the charge pump circuit 120, the switch 124 is opened and closed in response to an "acquire" signal being deasserted and asserted, respectively. The state of the acquire signal is controlled, for example, by a microprocessor or a timing circuit (not shown). When the acquire signal is not asserted (and the switch 124 is open), the charge pump circuit 120 and the loop filter 122 operate identically to the conventional charge pump circuit 20 and the conventional loop filter 22 shown in FIG. 2. However, when the acquire signal is asserted (and the switch 124 is closed), the current source $I_i$ provides additional charge to the capacitor C1 to bring the voltage V2 more quickly to the voltage level needed for phase frequency lock acquisition (i.e., the voltage controlling the VCO operating frequency that enables the loop to lock up/down to the frequency of the reference signal provided by the reference signal generator 12).

Figure 4:
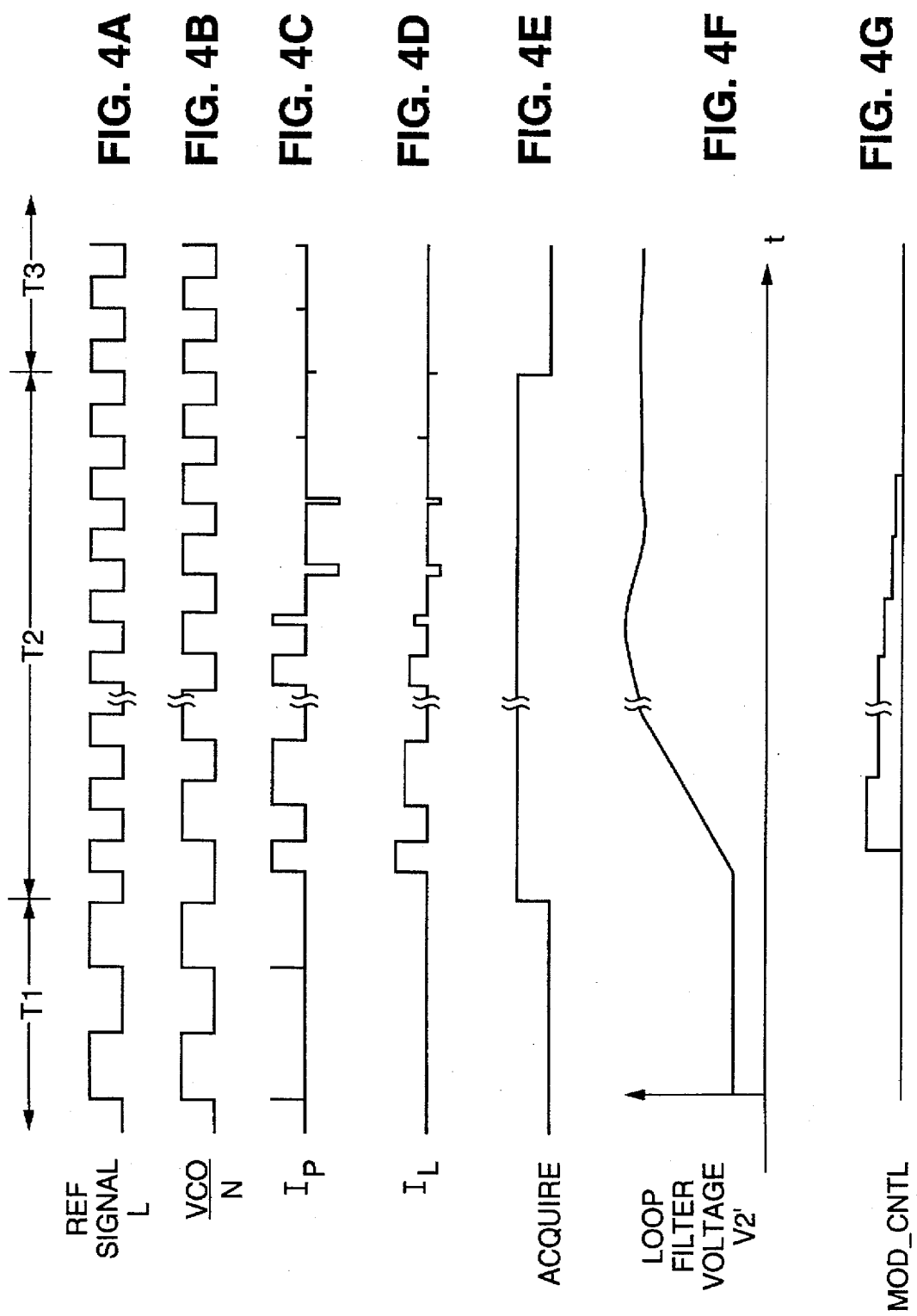
FIGS. 4A through 4G are a timing diagram which is provided for explaining the operation of the PLL 10 having the arrangement of the charge pump circuit 120 and the loop filter 122 shown in FIG. 3.

FIGS. 4A through 4H are a timing diagram which is helpful to understand the operation of the PLL circuit 10 having the arrangement of the charge pump circuit 120 and the loop filter 122 shown in FIG. 3. As shown in FIG. 4A, the reference signal L provided from the reference signal generator 12 initially (i.e., during time period T1) has a first frequency. During the time period T1, the acquire signal is not asserted (FIG. 4E) and the current source $I_p$ is providing only brief "correction" pulses (FIG. 4C) to keep the loop filter voltage V2' (FIG. 4G) at a first level so that the signal COMP output from the divide-by-N circuit 16 has a frequency equal to the frequency of the reference signal L. During the time period T1, the current source $I_i$ does not provide any current to the internal node 126 of the loop filter 122.

At the transition from time period T1 to time period T2, the frequency of the reference signal L is changed to have a second frequency that is higher than the first frequency. At the same time, the acquire signal is asserted. The assertion of the acquire signal causes the switch 124 (FIG. 3) to close such that the current source $I_i$ provides current pulses (FIG. 4D) to the internal node 126 of the loop filter 122 that are in phase with the current pulses provided by the current source $I_p$. In response to the current pulses $I_i$ and $I_p$, the control voltage V2' (FIG. 4F) rises over the time period T2 to a second level, causing the frequency of the signal COMP (FIG. 4B) output from the divide-by-N circuit 16 to rise to match the new frequency of the reference signal L. (In FIGS. 4A through 4G, the time period T2 is not drawn to scale.)

In a preferred embodiment of the charge pump circuit 120, the current source $I_i$ is provided with a modulation control signal MOD_CNTL (FIG. 4G) which causes the absolute value magnitude of the current pulses output from the current source $I_i$ to become more and more attenuated as the acquisition is neared. The shape of the MOD_CNTL signal may be empirically predetermined and stored in the microprocessor (not shown).

At the transition from the time period T2 to the time period T3 (i.e., after the control voltage V2' has risen to the second level so that the frequency of the signal COMP matches the new frequency of the reference signal L), the acquire signal is deasserted (FIG. 4E). In response to the acquire signal being desasserted, the switch 124 opens to a high impedance condition, such that the current source $I_i$ (FIG. 4D) discontinues providing current pulses to the internal node 126 of the loop filter 122. The current source $I_p$ continues to provide brief correction pulses (FIG. 4C) to keep the loop filter voltage V2' (FIG. 4F) at the second level so that the signal COMP output from the divide-by-N circuit 16 remains in phase-lock at a frequency which is equal to the new frequency of the reference signal L.

Figure 5:
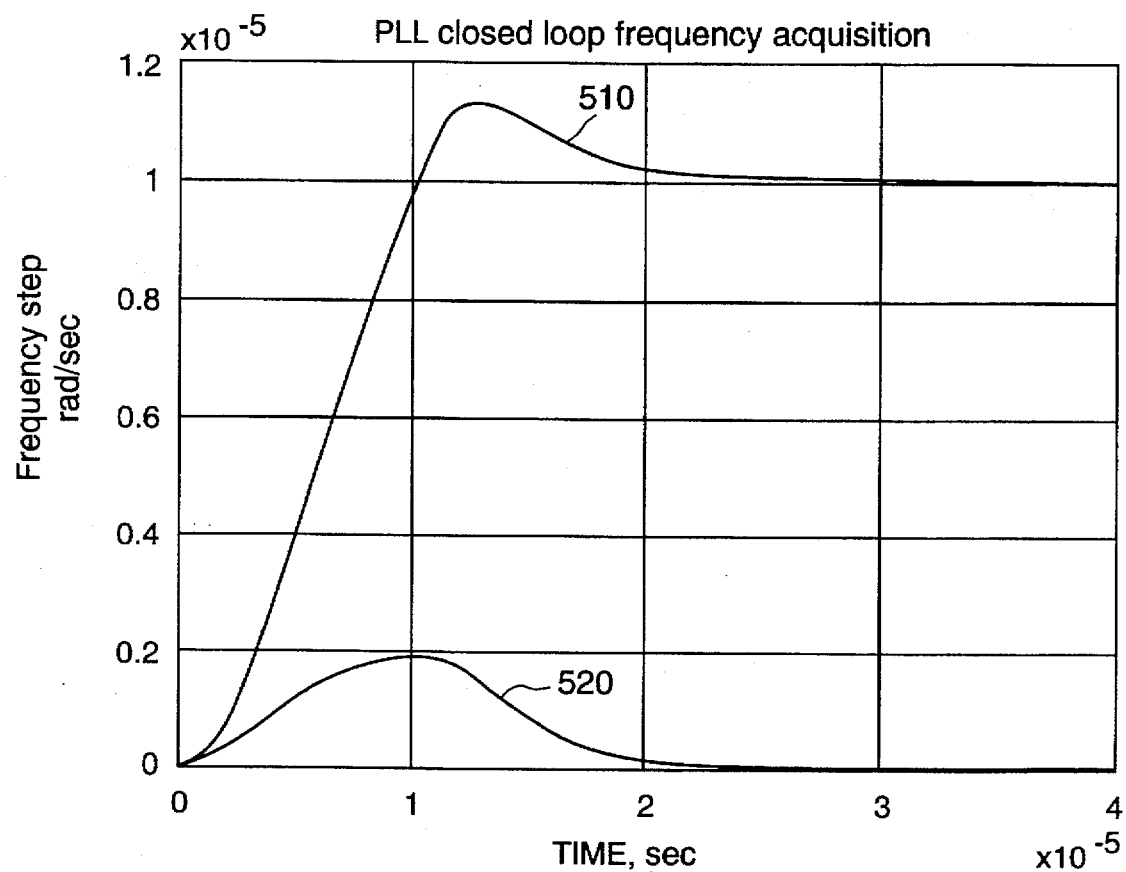
FIG. 5 shows the results of a simulated acquisition by the PLL 10 which utilizes the conventional arrangement of the charge pump circuit 20 and the loop filter 22.
Figure 6:
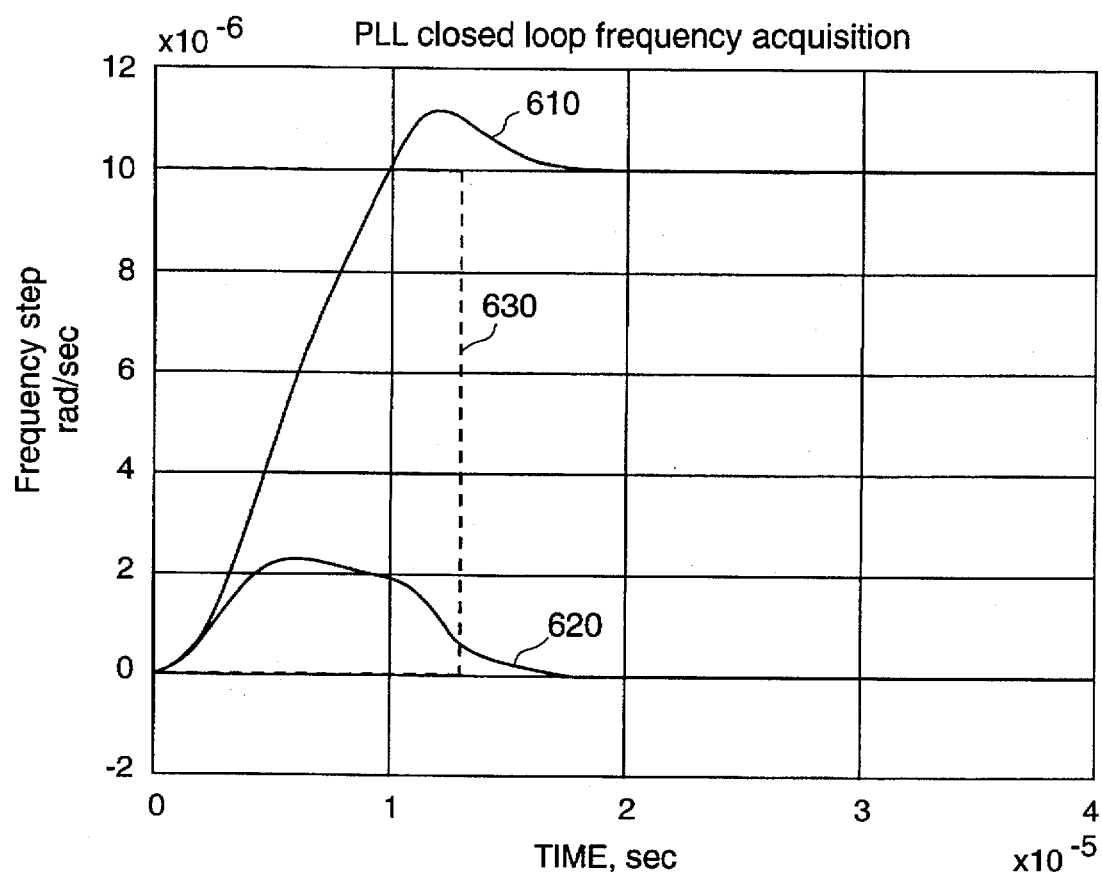
FIG. 6 shows the results of a simulated acquisition by the PLL 10 which utilizes the arrangement of the charge pump circuit 120 and the loop filter circuit 122 in accordance with an embodiment of the present invention.

FIG. 5 is a graph that shows the results of a simulated acquisition by the PLL 10 which utilizes the conventional arrangement of the charge pump circuit 20 and the loop filter 22. With reference to FIG. 5, line 510 shows the frequency of the signal COMP output from the divide-by-N circuit 16. Line 520 shows the time-averaged current provided to the capacitor C1 by the current source $I_p$. That is, the area under line 520 shows the amount of charge (and, thus, the voltage) stored on capacitor C1. By contrast, FIG. 6 shows the results of a simulated acquisition by the PLL 10 which utilizes the arrangement of the charge pump circuit 120 and the loop filter circuit 122 in accordance with an embodiment of the present invention. Line 610 shows the frequency of the signal COMP output from the divide-by-N circuit 16. Line 630 shows the amount of modulation indicated by the modulation control signal MOD_CNTL (i.e., how the absolute value magnitude of the current pulses output from current source $I_i$ are to become more and more attenuated). Line 620 shows the time averaged current collectively provided to the capacitor C1 by the current source $I_p$ and the current source $I_i$. As with the line 520 in FIG. 5, the area under line 620 shows the amount of charge (and, thus, the voltage) stored on capacitor C1. It can be seen that the addition of the current source $I_i$ substantially improves the acquisition time of the PLL 10.

Figure 7:
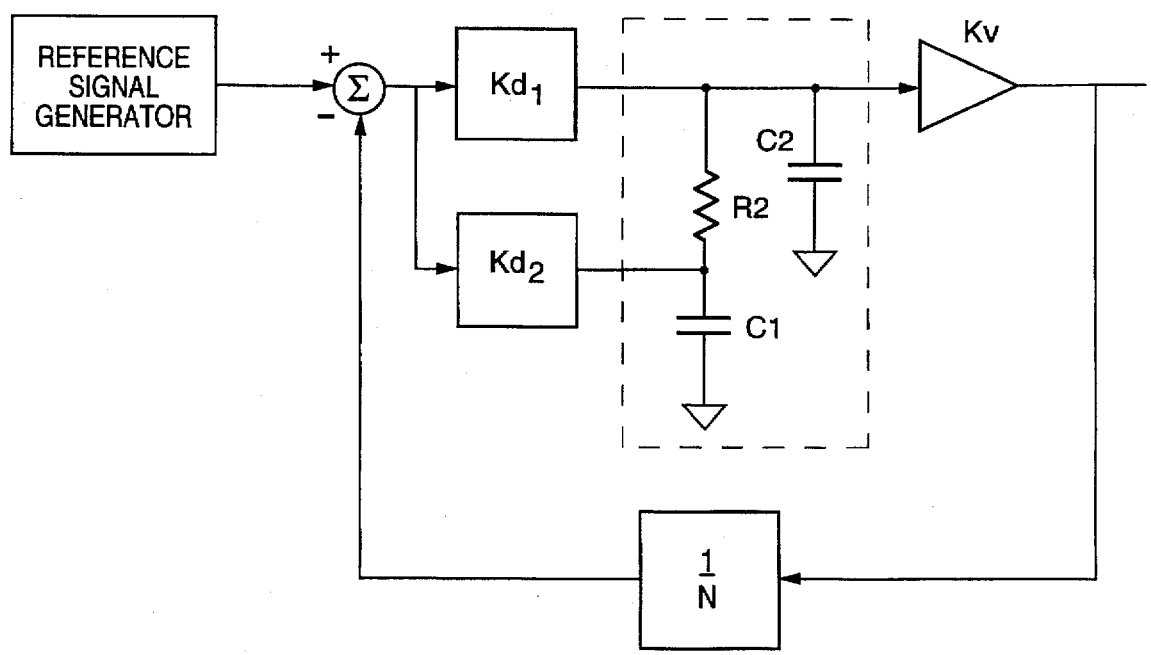
FIG. 7 illustrates, in block form, the parameters of the simulations which result in the graphs of FIG. 5 and FIG. 6.

The simulated circuit which results in the graph of FIG. 6 is shown schematically in FIG. 7, and the parameters of the simulated circuit are as shown in Table 1. The simulated circuit which results in the graph of FIG. 5 is identical to the circuit shown in FIG. 7, except that it does not include the secondary phase detector gain portion.

TABLE 1

| PLL SIMULATION PARAMETERS | | |
|---|---|---|
| Parameter | Value | Comment |
| Kv | 5e6 Mhz/volt | Oscillator Gain |
| Kd1 | 159e-6 amp/radian | Proportional phase detector gain |
| Kd2 | 215e-6 amp/radian | Secondary phase detector gain |
| Ip | .001 amp | Proportional charge pump current |
| Ii | .00135 amp | Integral charge pump current |
| N | 10 | PLL feedback divisor |
| R2 | 8.8 KΩ | Loop Filter Resistor |
| C1 | 64 pF | Loop Filter Capacitor |
| C2 | 573 pF | High-Frequency Compensation Capacitor |

What is claimed is:

1. A control signal generation circuit particularly suited for use in a phase lock loop circuit for providing a control signal to a voltage controlled oscillator, via an output of the control signal generation circuit, in response to a phase difference signal provided by phase comparator circuitry to an input of the control signal generation circuit, the control signal generation circuit comprising:

charge pump circuitry having an input which is the input of the control signal generation circuit, and having a primary current signal output and a secondary current signal output, the charge pump circuitry including:
  a primary current source, connected to the input of the charge pump circuitry to receive the phase difference signal and that provides a primary current signal to the primary current signal output in response thereto; and
  a secondary current source, also connected to the input of the charge pump circuitry to receive the phase difference signal and that provides a secondary current signal to the secondary current signal output in response thereto; and
filter circuitry having a first filter input connected to receive the primary current signal and a second filter input connected to receive the secondary current signal, and further having a filter output which is the output of the control signal generation circuit, the filter circuitry including:
  a resistance element connected between the first filter input and the second filter input; and
  a capacitance element connected between the second filter input and ground wherein a voltage, relative to ground, is developed at the first filter input and provided to the filter output as the control signal wherein the charge pump circuit includes secondary current source control circuitry for controlling a magnitude of the secondary current signal.

2. The circuit of claim 1, wherein the charge pump circuit is further connected to receive an acquire control signal, and wherein the secondary current source provides the secondary current signal to the secondary current signal output only in response to the acquire control signal being asserted.

3. The circuit of claim 1, wherein the secondary current source control circuitry controls the magnitude of the secondary current signal responsive to a modulation control signal.

4. The circuit of claim 3, wherein the modulation control signal has a shape such that the secondary current source control circuitry controls the secondary current signal to become more and more attenuated as the phase lock loop circuit nears acquisition.

5. The circuit of claim 1, wherein the primary current signal is in phase with the secondary current signal.

* * * * *

UNITED STATES PATENT AND TRADEMARK OFFICE
CERTIFICATE OF CORRECTION

PATENT NO.: 5,675,291
DATED: October 7, 1997
INVENTOR(S): Douglas Sudjian

It is certified that error appears in the above-identified patent and that said Letters Patent is hereby corrected as shown below:

On the title page, item [54], and column 1, line 2,
 delete "ACQUISTION" and insert --ACQUISITION--.

Signed and Sealed this

Ninth Day of December, 1997

Attest:

BRUCE LEHMAN

Attesting Officer

Commissioner of Patents and Trademarks